United States Patent
Kruwinus

Patent Number: 6,016,612
Date of Patent: Jan. 25, 2000

[54] PROCESS AND DEVICE FOR DRYING OF SUBSTRATES

[76] Inventor: Hans-Jurgen Kruwinus, Lobisserweg 15, Bodensdorf, Austria

[21] Appl. No.: 08/942,540

[22] Filed: Oct. 1, 1997

[30] Foreign Application Priority Data

Oct. 1, 1996 [AT] Austria ................................ 1734/96

[51] Int. Cl.[7] ........................................... F26B 3/34
[52] U.S. Cl. .................. 34/276; 34/275; 34/266; 34/268; 432/239; 438/471; 438/795
[58] Field of Search ................................. 34/266, 268, 275, 34/276; 432/239, 241, 253; 438/471, 473, 474, 475, 795, 796, 797, 798, 799

[56] References Cited

U.S. PATENT DOCUMENTS

| | | | |
|---|---|---|---|
| 4,131,487 | 12/1978 | Pearce et al. | 148/1.5 |
| 4,336,279 | 6/1982 | Metzger | 427/55 |
| 4,687,544 | 8/1987 | Bersin | 156/643 |
| 4,736,758 | 4/1988 | Kusuhara | 134/66 |
| 5,044,314 | 9/1991 | McNeilly | 118/715 |
| 5,225,355 | 7/1993 | Sugino et al. | 437/10 |
| 5,228,206 | 7/1993 | Grant et al. | 34/275 |
| 5,531,857 | 7/1996 | Engelsberg et al. | 156/345 |
| 5,722,761 | 3/1998 | Knight | 362/96 |

FOREIGN PATENT DOCUMENTS

| | | |
|---|---|---|
| 0 316 835 | 5/1989 | European Pat. Off. . |
| 0 553 967 | 8/1993 | European Pat. Off. . |

*Primary Examiner*—William Doerrler
*Assistant Examiner*—Pamela A. Wilson
*Attorney, Agent, or Firm*—Young & Thompson

[57] ABSTRACT

To dry semiconductor substrates, especially silicon wafers subsequent to rinsing after etching, the substrate is exposed to the action of radiation which contains an IR portion and a UV portion, the IR portion being greater than the UV portion. The IR-UV radiation quickly dries the substrate and prevents contamination of the substrate with undesirable particles or limits it to a nondisruptive degree. To execute drying with IR-UV radiation, an arrangement is proposed in which the substrate is moved through directly from the treatment liquid (rinsing medium) between two rod-shaped radiators which emit IR-UV radiation.

32 Claims, 3 Drawing Sheets

PROCESS AND DEVICE FOR DRYING OF SUBSTRATES

BACKGROUND OF THE INVENTION

The invention relates to a process and devices for drying of substrates, especially semiconductor substrates, such as silicon wafers, gallium arsenide wafers, but also glass and quartz substrates, metal substrates and compact discs.

The substrates to be treated as claimed in the invention with the purpose of drying need not be exclusively round or wafer-shaped, but can have any shape. The preferred area of application however is the drying of wafer-shaped substrates.

In the invention the drying of semiconductor substrates such as silicon wafers or semiconductor substrates based on gallium arsenide is especially emphasized.

DESCRIPTION OF THE RELATED ART

When silicon wafers are dried it is especially disadvantageous that during the drying process a particle increase which has an adverse effect on the semiconductor wafer occurs, therefore drying without residue is impossible. This applies to all known drying processes which work with spinners, with the action of isopropanol vapor or with high-speed rotation of the wafer around an axis perpendicular to its surface.

The cause of the aforementioned adverse particle formation in silicon wafers is that water reacts with silicon to form silicon oxide-like (quartz-like) compounds.

SUMMARY OF THE INVENTION

The object of the invention is to remove, as quickly as possible, liquid residues, especially residues of deionized water which can be located on the surface of the substrate, especially of a plate-shaped article, especially a silicon wafer, from prior treatment steps, so that the aforementioned particle formation does not occur or does so to only to a nondisruptive degree.

The object of the invention is achieved by a process disclosed below.

The process of the invention is used primarily for drying of wafer-shaped substrates of semiconductor engineering, especially of silicon wafers, after treatment with a liquid, especially after rinsing subsequent to etching treatment, the substrate being treated with radiation which contains an infrared portion and an ultraviolet portion.

In the invention the difficulty in removal of liquid residues from surfaces, which consists in treating the surface such that neither impurities in the liquid residue remain after removing the liquid on the substrate surface nor the material of the substrate be changed by the action of heat during drying treatment or other impurities be applied by treatment is resolved both simply and effectively.

When the process of the invention is used, the surfaces of especially plate-shaped articles are treated such that liquid residues on the surface of the substrate are removed from the surface without touching it, and that neither impurities remain nor the structure of the material of the especially wafer-shaped or plate-shaped substrate is changed by treatment.

Other details and features of the process of the invention and the devices (arrangements) of the invention for executing the process follow from the following description of exemplary embodiments shown in the drawings and from examples for the process.

DESCRIPTION OF THE PREFERRED EMBODIMENTS

In the drying process of the invention the substrate to be dried is treated with radiation which contains both an infrared (IR) portion and also an ultraviolet (UV) portion, the infrared portion preferably predominating, and the ratio of the IR portion to the UV portion can be in the range between 50:1 and 20:1.

Figure 1:
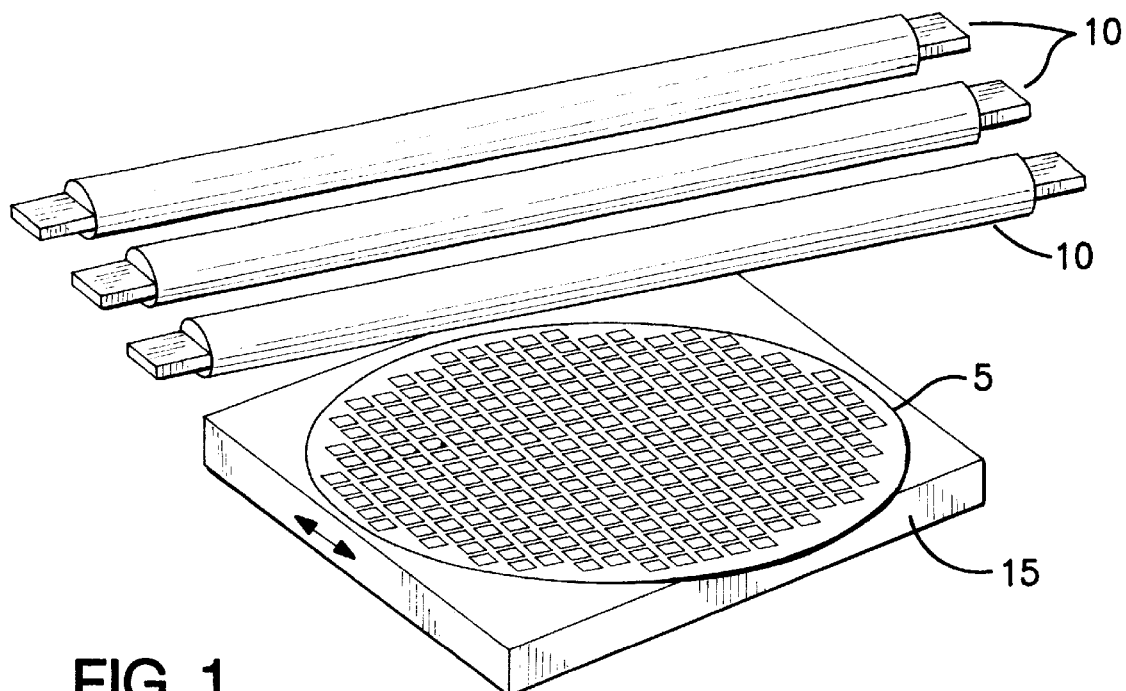
FIG. 1 shows in largely schematic form a first arrangement for executing the process as claimed in the invention.

In the arrangement shown in FIG. 1 the substrate 5 to be treated, in the example a silicon wafer, is moved relative to the radiator 10 by suitable movement means 15, it being essentially horizontally aligned. It is also conceivable that several radiators aligned parallel to one another be provided next to one another so that by combination with the motion of the substrate relative to at least one rod-shaped radiator uniform treatment of the surface is achieved.

Basically it is also conceivable that the radiator be moved relative to the substrate to be dried, since for the version shown in FIG. 1 what matters is essentially the relative motion between the radiation source and substrate in order to achieve uniform drying.

Figure 2:
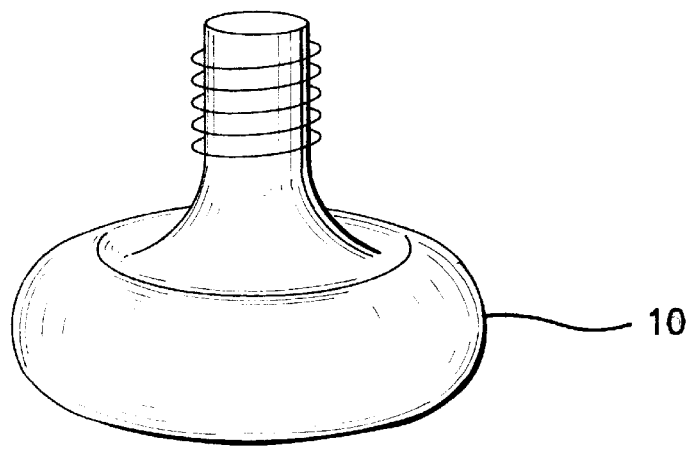
FIG. 2 shows a second embodiment and FIG. 3 shows one embodiment with two radiators.
Figure 2:
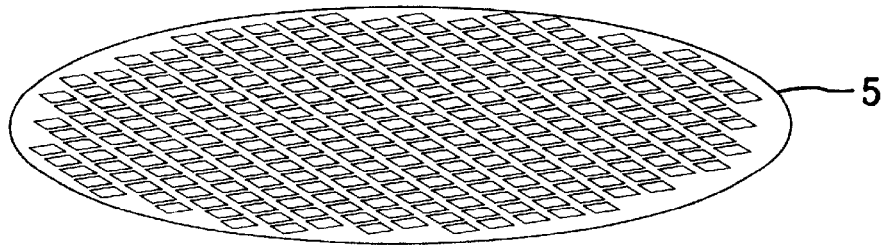

In the embodiment shown in FIG. 2 the radiator is made such that it has a shape matched to the contour of the substrate to be dried, here a silicon wafer, therefore in the exemplary embodiment from FIG. 2 it is roughly round and otherwise has a roughly pear-shape. In the embodiment shown in FIG. 2 it is no longer necessary to move the substrate relative to the radiator during actual drying.

Figure 3:
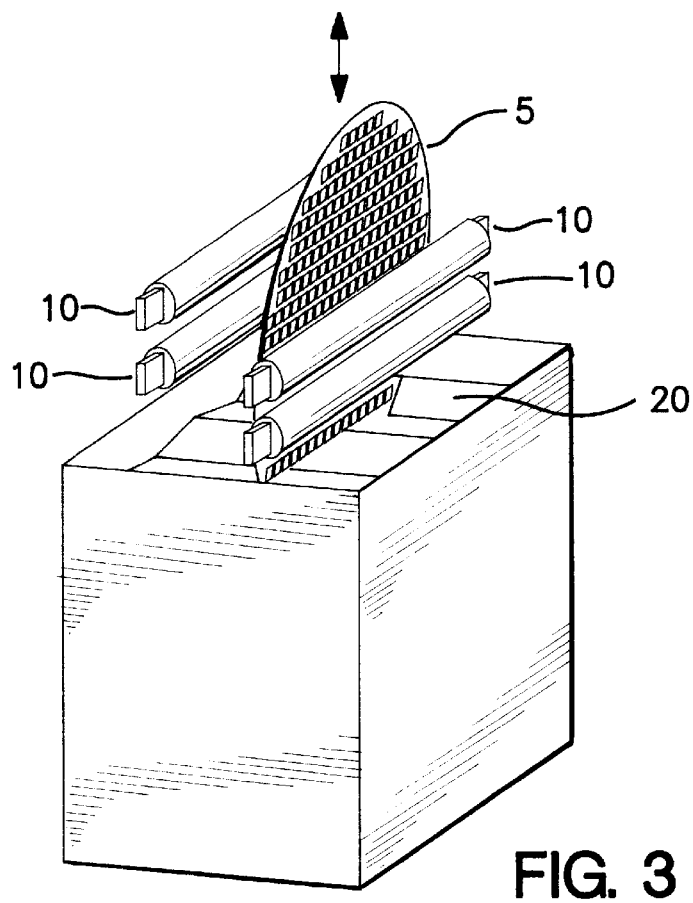

In the embodiment shown in FIG. 3 a substrate removed to the top from a vessel containing a treatment medium (here a semiconductor wafer, especially a silicon wafer) is moved through immediately after emergence from the treatment medium 20 between two radiators aligned in parallel so that drying takes place immediately after removal of the substrate from the treatment medium. In the embodiment of the device shown in FIG. 3 several radiators parallel to one another can also be arranged on top of one another on one or both sides of the path of the substrate to be dried similar to that shown in FIG. 1.

In all embodiments the treatment time can be between 5 and 60 seconds. In the embodiment from FIG. 2 treatment times between 1 and 4 seconds are also possible. The distance between the substrate and radiator can be 1 to 150 mm in the embodiments shown in FIGS. 1 and 2, conversely in the embodiment shown in FIG. 3 the distance of the radiators from one another is 2 to 150 mm and preferably the substrate is routed through exactly between the radiators so that they are located a distance of between 1 and 75 mm from the surface of the substrate.

Figure 4:
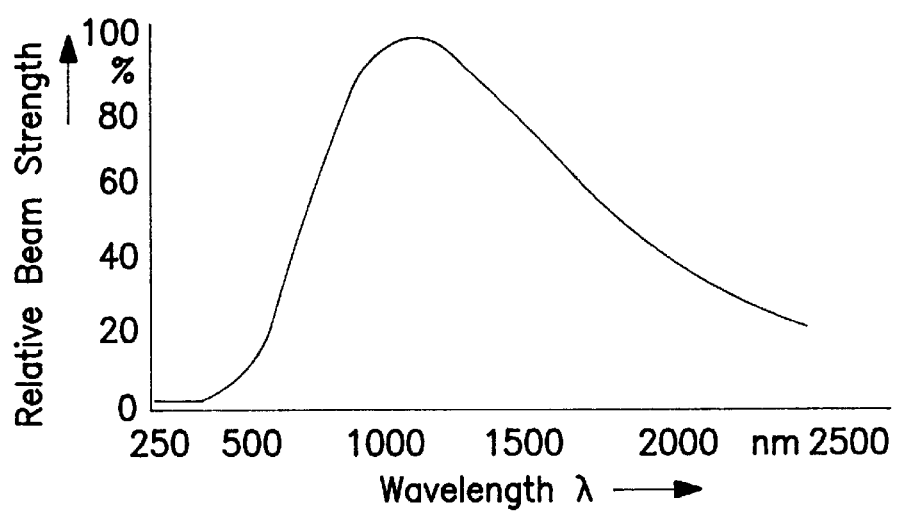
FIG. 4 shows the relative spectral radiation distribution of a halogen infrared radiator preferably used in the process as claimed in the invention and FIGS. 5 through 7 show diagrams for the test and exemplary embodiments 1 and 2.

The radiators used preferably in the process as claimed in the invention are halogen-infrared radiators which emit radiation with a relative spectral radiation distribution for example which corresponds to the radiation distribution in FIG. 4. In this embodiment the portion of infrared radiation (therefore starting from roughly 1100 nanometers wavelength) exceeds 90%, while the UV range (below roughly 50 nanometers wavelength) is roughly 2 to 5%. Radiators used within the framework of the invention are halogen lamps or mercury vapor lamps.

These are however only special ratios preferred within the framework of the invention between the UV and IR portion in the radiation emitted from the radiator when drying in the process of the invention. Generally it can be stated that in the invention a predominance of the IR portion over the UV portion in the radiation is preferred and yields the best results.

Test:

In this test the cleanness of the IR-UV radiation source and the test set-up for handling the wafers was checked. The working conditions in this test were the following:

Substrate: silicon wafer, diameter 6 inches.

IR-UV radiator: radiation distribution as in FIG. 4.

Substrate-radiator spacing: 15 mm.

Exposure time: 18 seconds.

Liquid which was removed by drying: water.

Pretreatment of the substrate with 5% hydrofluoric acid.

Figures 5, 6, 7:
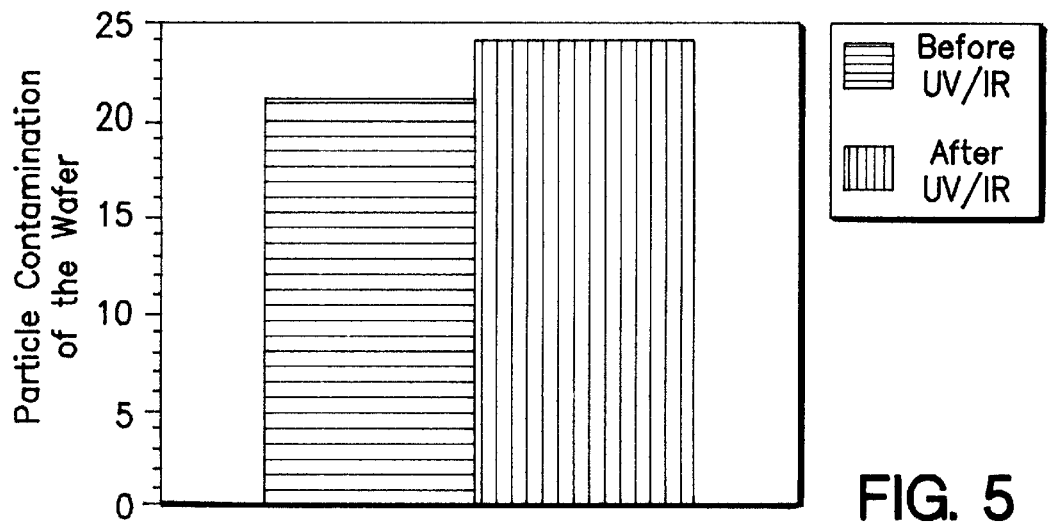

The diagram shown in FIG. 5 illustrates that particle contamination on the wafer has risen only by three particles after irradiation of the wafer. This, although feed and removal were manually actuated.

EXAMPLE 1

In this example the particle-optimized HF etching (pure) process was examined with and without additional IR-UV irradiation during drying. The number of particles on the studied wafer was <10 particles $\geq 0.12$ $\mu m^2$.

The working conditions in this example were the following:

Substrate: silicon wafer, diameter 6 inches.

IR-UV radiator: radiation distribution as in FIG. 4.

Substrate-radiator spacing: 15 mm.

Exposure time: 18 seconds.

Liquid which was removed by drying: water.

Pretreatment of the substrate with 5% hydrofluoric acid.

In the diagram shown in FIG. 6 the particle increase without IR-UV radiation during drying is compared to the particle increase which occurs when treatment with IR-UV radiation is done. It is indicative that when IR-UV radiation is used during drying contamination increased only by five particles.

EXAMPLE 2

In this example the effect of IR-UV radiation on a silicon wafer contaminated beforehand with particles was studied. The results are reproduced in the diagram of FIG. 7.

The working conditions in this example were the following:

Substrate: silicon wafer, diameter 6 inches.

IR-UV radiator: radiation distribution as in FIG. 4.

Substrate-radiator spacing: 15 mm.

Exposure time: 18 seconds.

Liquid which was removed by drying: water.

Pretreatment of the substrate with 5 hydrofluoric acid.

The diagram in FIG. 7 shows that the combination of etching treatment with hydrofluoric acid with IR-UV radiation for subsequent drying resulted in a reduction of the particles with which the wafer was contaminated. This is surprising since for a long time etching processes with hydrofluoric acid always led to a particle increase.

In summary the test and the examples show that by drying with IR-UV radiation the extent of contamination of substrates, especially of silicon wafers with (contaminating) particles, is prevented and that by drying with IR-UV radiation after etching with hydrofluoric acid the extent of contamination of contaminated wafers could be reduced.

In summary, one exemplary embodiment of the invention can be described as follows:

To dry semiconductor substrates, especially silicon wafers subsequent to rinsing after etching, the substrate is exposed to the action of radiation which contains an IR and an UV portion, the IR portion being larger than the UV portion. The IR-UV radiation quickly dries the substrate and prevents contamination of the substrate with undesirable particles or limits it to a nondisruptive degree.

To execute the process with IR-UV radiation an arrangement is proposed in which the substrate is moved through directly from the treatment liquid (rinsing medium) between two rod-shaped radiators which emit IR-UV radiation.

I claim:

1. A drying process for semiconductor substrates comprising the step of:

treating a substrate with radiation which comprises an infrared radiation component and an ultraviolet radiation component, wherein the ratio of the infrared radiation component to the ultraviolet radiation component is in the range between 50:1 and 20:1.

2. The process of claim 1, wherein both sides of the substrate is treated with radiation.

3. The process of claim 1, comprising the further step of providing relative motion between a radiator of the radiation and the substrate.

4. The process of claim 1, comprising the further step of providing a radiator of the radiation, the radiator being shaped to match to a contour of the substrate being dried.

5. The process of claim 1, comprising the further steps of removing the substrate from a vessel containing a treatment medium, and moving the substrate between two radiators aligned in parallel so that drying takes place immediately after removal of the substrate from the treatment medium.

6. The process of claim 5, comprising the further step of separating the two radiators by a distance of 2 to 150 mm.

7. The process of claim 1, comprising the further step of separating the substrate and a radiator of the radiation by 1 to 150 mm.

8. The process of claim 1, comprising the further step of providing the radiation with a radiator comprising one of a halogen lamp and a mercury vapor lamp.

9. A drying process for semiconductor substrates comprising the step of:

treating a substrate with radiation which comprises an infrared radiation component and an ultraviolet radiation component, wherein the radiation comprises a relative radiation intensity which corresponds to the following diagram:

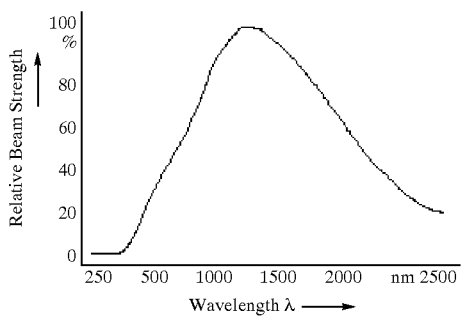

10. The process of claim 9, wherein both sides of the substrate is treated with radiation.

11. The process of claim 9, comprising the further step of providing relative motion between a radiator of the radiation and the substrate.

12. The process of claim 9, comprising the further step of providing a radiator of the radiation, the radiator being shaped to match to a contour of the substrate being dried.

13. The process of claim 9, comprising the further steps of removing the substrate from a vessel containing a treatment medium, and moving the substrate between two radiators aligned in parallel so that drying takes place immediately after removal of the substrate from the treatment medium.

14. The process of claim 13, comprising the further step of separating the two radiators by a distance of 2 to 150 mm.

15. The process of claim 9, comprising the further step of separating the substrate and a radiator of the radiation by 1 to 150 mm.

16. The process of claim 9, comprising the further step of providing the radiation with a radiator comprising one of a halogen lamp and a mercury vapor lamp.

17. A drying process for semiconductor substrates comprising the step of:
   treating a substrate with radiation which comprises an infrared radiation component and an ultraviolet radiation component, the infrared radiation component with a wavelength exceeding 1100 nanometers exceeding 90% of the total radiation and the ultraviolet radiation component with a wavelength under 50 nm being 2 to 5% of the total radiation.

18. The process of claim 17, wherein both sides of the substrate is treated with radiation.

19. The process of claim 17, comprising the further step of providing relative motion between a radiator of the radiation and the substrate.

20. The process of claim 17, comprising the further step of providing a radiator of the radiation, the radiator being shaped to match to a contour of the substrate being dried.

21. The process of claim 17, comprising the further steps of removing the substrate from a vessel containing a treatment medium, and moving the substrate between two radiators aligned in parallel so that drying takes place immediately after removal of the substrate from the treatment medium.

22. The process of claim 21, comprising the further step of separating the two radiators by a distance of 2 to 150 mm.

23. The process of claim 22, comprising the further step of separating the substrate and a radiator of the radiation by 1 to 150 mm.

24. The process of claim 17, comprising the further step of providing the radiation with a radiator comprising one of a halogen lamp and a mercury vapor lamp.

25. An apparatus for drying a semiconductor substrate comprising:
   at least one radiator adapted to treat a substrate with radiation, said radiator emitting an infrared radiation component and an ultraviolet radiation component, wherein the ratio of the infrared radiation component to the ultraviolet radiation component is in the range between 50:1 and 20:1.

26. The apparatus of claim 25, wherein said one radiator comprises a rod shape.

27. The apparatus of claim 25, wherein said apparatus comprises said one rod-shaped radiator aligned next to and parallel to at least one other rod-shaped radiator.

28. The apparatus of claim 25, wherein said apparatus comprises plural radiators positioned in two rows and radiators of each of said two rows are aligned parallel to one another.

29. The apparatus of claim 25, wherein said one radiator is adapted for being positioned directly above a chamber for treating the substrate.

30. The apparatus of claim 25, wherein said one radiator comprises a radiation surface which matches a shape of an outline of the substrate.

31. The apparatus of claim 25, wherein said one radiator comprises a radiation surface arrangement as claimed in claim 12, wherein there is a radiator with wafer-shaped radiation surface for treating the wafer-shaped substrates.

32. The apparatus of claim 25, wherein said one radiator further emits the infrared radiation component with a wavelength exceeding 1100 nanometers exceeding 90% of the total radiation and the ultraviolet radiation component with a wavelength under 50 nm being 2 to 5% of the total radiation.

* * * * *